(12) United States Patent  
Suwa et al.

(10) Patent No.: US 7,095,623 B2  
(45) Date of Patent: Aug. 22, 2006

(54) MULTILAYER CIRCUIT BOARD, PROCESS OF MANUFACTURING SAME, BOARD FOR MULTILAYER CIRCUITRY, AND ELECTRONIC APPARATUS

(75) Inventors: Tokihito Suwa, Hitachinaka (JP); Haruo Akahoshi, Hitachi (JP); Shingo Kumamoto, Yasugi (JP)

(73) Assignee: Hitachi, Ltd., Tokyo (JP)

( * ) Notice: Subject to any disclaimer, the term of this patent is extended or adjusted under 35 U.S.C. 154(b) by 37 days.

(21) Appl. No.: 10/445,000

(22) Filed: May 27, 2003

(65) Prior Publication Data

US 2003/0218871 A1    Nov. 27, 2003

(30) Foreign Application Priority Data

May 27, 2002    (JP)    ............................... 2002-152342

(51) Int. Cl.  
*H05K 1/11*    (2006.01)  
*H05K 1/14*    (2006.01)  
(52) U.S. Cl. ...................................... 361/795; 174/262  
(58) Field of Classification Search ................ 174/268, 174/257, 261, 262, 265, 266, 255; 428/209, 428/901; 361/795  
See application file for complete search history.

(56) References Cited

U.S. PATENT DOCUMENTS

| | | | |
|---|---|---|---|
| 5,629,564 A * | 5/1997 | Nye et al. | 257/762 |
| 6,248,958 B1 * | 6/2001 | McClure et al. | 174/256 |
| 6,518,509 B1 * | 2/2003 | Galasco et al. | 174/256 |

FOREIGN PATENT DOCUMENTS

| | | |
|---|---|---|
| JP | 05327227 | 12/1993 |
| JP | 6-85414 | 3/1994 |
| JP | 09162550 | 6/1997 |
| JP | 11274720 | 10/1999 |
| JP | 11-354684 | 12/1999 |
| JP | 2001-189536 | 7/2001 |

* cited by examiner

*Primary Examiner*—Kamand Cuneo  
*Assistant Examiner*—Yuriy Semenenko  
(74) *Attorney, Agent, or Firm*—Mattingly, Stanger, Malur & Brundidige, P.C.

(57) ABSTRACT

A multilayer circuit board having a high level of reliability in terms of electric connection against temperature changes caused by the actual operation of electronic equipment, a manufacturing process, a substrate for multilayer circuitry, and an electronic apparatus. The multilayer circuit board comprises a laminate of at least one insulating layer and at least one wiring layer, wherein the wiring layer is formed by a composite member comprising a first metal layer and a second metal layer formed on one or both sides of the first metal layer, the first metal layer having a smaller coefficient of thermal expansion than the second metal layer, the second metal layer having a higher electric conductivity than the first metal layer, wherein the insulating layer has a blind via-hole with a bottom provided by a surface of the second metal layer, the circuit board further comprising a layer-to-layer interconnection portion on the surface of the insulating layer and in the blind via-hole, wherein the layer-to-layer interconnection portion in the blind via-hole is formed in such a manner as to be in contact with the surface of the second metal layer.

13 Claims, 10 Drawing Sheets

MULTILAYER CIRCUIT BOARD, PROCESS OF MANUFACTURING SAME, BOARD FOR MULTILAYER CIRCUITRY, AND ELECTRONIC APPARATUS

BACKGROUND OF THE INVENTION

1. Technical Field

The present invention relates to a novel low thermal-expansion multilayer circuit board suitable for the mounting of semiconductor devices, a method of manufacturing the same, a substrate for multilayer circuits, and an electronic apparatus.

2. Background Art

In recent years, semiconductor chips are often mounted directly on circuit boards by the so-called bear chip mounting technique, whereby mounting takes place directly without the use of leaded package. However, because the coefficient of thermal expansion of semiconductor devices differs from that of circuit boards, cracks or peeling can occur in the solder-connected portions linking semiconductor devices and circuit boards. This occurs due to temperature changes that result when the electronic equipment on which a circuit board is mounted is activated, leading to faulty electrical connections. In order to bring the coefficient of thermal expansion of the circuit board closer to that of the semiconductor devices, a metal-core substrate has been adopted in which a plate of an alloy with a small coefficient of thermal expansion is laid.

Iron-nickel alloys with a nickel content of about 36–42 mass % are often used for the alloy plate. This is because their coefficient of thermal expansion is about $1-5 \times 10^{-6}/°$ C., which is on the same order as the coefficient of thermal expansion of silicon in the semiconductor devices, which is about $3 \times 10^{-6}/°$ C. While the iron-nickel alloy forming the core is electrically insulated from the circuit in a typical metal-core substrate, it is sometimes used as a power supply or ground circuit. However, the iron-nickel alloys are not suitable for use in circuits because their electric conductivity is low.

JP Patent Publication (Unexamined Application) No. 6-85414 discloses the use of a composite member comprising an iron-nickel alloy coated by copper on either side in a printed circuit board. The publication, however, does not describe layer-to-layer interconnection.

JP Patent Publication (Unexamined Application) No. 11-354684 discloses the formation of a composite member in which an iron-nickel alloy coated with copper on one side is stacked via a polyimide-resin insulating layer. While the publication also describes through-hole via-holes, the layer-to-layer interconnection is carried out by soldering.

JP Patent Publication (Unexamined Application) Nos. 5-251868, 9-162550, 11-261236, and 2001-342574 each disclose multilayer circuit boards having blind via-holes communicated to the wiring layer, where a circuit pattern is formed in the non-through holes.

None of the publications, however, disclose the formation of layer-to-layer interconnections in a low expansion multilayer wiring board comprising an iron-nickel alloy composite member formed with copper plating. Further, the publication in which a circuit pattern is formed in blind via-holes does not disclose a low expansion wiring board. While JP Publication (Unexamined Application) No. 2001-342574 discloses the example of an iron-nickel alloy in the core substrate, it does not describe the wiring of the iron-nickel alloy and its layer-to-layer interconnection.

JP Patent Publication (Unexamined Application) No. 11-354684 does not disclose the formation of outer-layer wiring on the insulator surface by plating.

SUMMARY OF THE INVENTION

It is an object of the invention to provide a multilayer circuit board having a high level of reliability against temperature changes in the electronic equipment during operation in terms of electrical connections between layers, a process of manufacturing the same, a substrate for multilayer circuits, and an electronic apparatus.

In one aspect, the invention provides a multilayer circuit board comprising a laminate of at least one insulating layer and at least one wiring layer, wherein the wiring layer is formed by a composite member comprising a first metal layer and a second metal layer formed on one or both sides of the first metal layer, the first metal layer having a smaller coefficient of thermal expansion than the second metal layer, the second metal layer having a higher electric conductivity than the first metal layer, wherein the insulating layer has a blind via-hole whose bottom portion is formed by a surface of the second metal layer, the circuit board further comprising a layer-to-layer interconnection portion on the surface of the insulating layer and in the blind via-hole, wherein the layer-to-layer interconnection portion in the blind via-hole is formed in such a manner as to be in contact with the surface of the second metal layer.

In another aspect, the invention provides a multilayer circuit board comprising at least one wiring layer formed in insulating layers, wherein the wiring layer is formed by a composite member comprising a first metal layer and a second metal layer formed on either side of the first metal layer, the first metal layer having a smaller coefficient of thermal expansion than the second metal layer, the second metal layer having a higher electric conductivity than the first metal layer, wherein each of the insulating layers separated by the wiring layer has a blind via-hole whose bottom portion is formed by a surface of the second metal layer where the insulating layers face one another via the wiring layer, wherein the circuit board further comprises a layer-to-layer interconnection portion on the surface of the insulating layer and in the blind via-hole, wherein the layer-to-layer interconnection portion in each blind via-hole is formed in such a manner as to be in contact with the second metal layer surface.

Preferably, the first metal layer comprises an alloy or an iron-nickel alloy layer having a thermal expansion coefficient of not more than $10 \times 10^{-6}/°$ C., preferably from 2 to $5 \times 10^{-6}/°$ C. The iron-nickel alloy layer is either 42 alloy, which is an iron alloy containing 27–50 mass % of nickel, or covar, which is an alloy in which the nickel is substituted with 20 mass % of cobalt. The second metal layer is preferably copper.

In yet another aspect, the invention provides a process of manufacturing a multilayer circuit board in which at least one insulating layer and at least one wiring layer are laminated, the process comprising the steps of:

forming a wiring on the wiring layer in a composite member comprising the wiring layer and the insulating layer integrally formed on the wiring layer, the wiring layer comprising a second metal layer formed on one or both sides of a first metal layer, wherein the second metal layer has a larger coefficient of thermal expansion than the first metal layer;

forming a blind via-hole in the insulating layer such that a bottom portion of the via-hole is formed by a surface of the second metal layer;

forming a layer-to-layer interconnection portion on the surface of the insulating layer and in the blind via-hole in such a manner as to be in contact with the second metal layer surface that forms the blind via-hole bottom portion.

In yet another aspect, the invention provides a process of manufacturing a multilayer circuit board comprising an insulating layer in which at least one wiring layer is formed, the process comprising the steps of:

forming a wiring on the wiring layer in a composite member comprising the wiring layer and the insulating layer integrally formed on the wiring layer, the wiring layer comprising a second metal layer formed on one or both sides of a first metal layer, wherein the second metal layer has a larger coefficient of thermal expansion than the first metal layer;

forming a blind via-hole in each insulating layer where the insulating layers are opposite one another via the wiring layer, the blind via-hole having a bottom portion formed by a surface of the second metal layer; and forming a layer-to-layer interconnection portion on the surface of the insulating layers and in each blind via-hole in such a manner as to be in contact with the second metal layer surface forming the blind via-hole bottom portion.

In a further aspect, the invention provides a process of manufacturing a multilayer circuit board comprising the steps of:

preparing a wiring layer formed by a composite member comprising a first metal layer and a second metal layer formed on one or both sides of the first metal layer, the second metal layer having a higher electric conductivity and a greater coefficient of thermal expansion than the first metal layer;

forming a substrate for multilayer circuitry by laminating the wiring layer on one or both sides of an insulating resin layer;

forming a predetermined wiring on the wiring layer;

covering the wiring formed in the wiring forming step with an insulating layer;

forming a blind via-hole in the insulating layer, or the insulating layer and insulating resin layer, the blind via-hole having a bottom portion formed by a surface of the second metal layer; and forming a layer-to-layer interconnection portion on the surface of the insulating layer and in the blind via-hole in such a manner as to be in contact with the second metal layer surface in the blind via-hole.

In a further aspect, the invention provides a process of manufacturing a multilayer circuit board comprising the steps of:

preparing a wiring layer formed by a composite member comprising a first metal layer and a second metal layer formed on both sides of the first metal layer, the second metal layer having a higher electric conductivity and a greater coefficient of thermal expansion than the first metal layer;

forming a substrate for multilayer circuitry by laminating the wiring layer on both sides of an insulating layer;

forming a predetermined wiring on the wiring layer formed in the wiring preparing step;

covering the wiring formed in the wiring forming step with an insulating layer;

forming a blind via-hole in each insulating layer, or the insulating layer and insulating resin layer on the opposite surfaces between which the insulation layer is inserted, the blind via-hole having a bottom portion formed by a surface of the second metal layer; and forming a layer-to-layer interconnection portion on the surface of the insulating layer and in the blind via-hole in such a manner as to be in contact with the surface of the second metal layer in each blind via-hole.

In a further aspect, the invention provides a substrate for multilayer circuitry comprising a composite member comprising a first metal layer and a second metal layer formed on one or both sides of the first metal layer, the composite member thermally glued under pressure to one or both sides of an insulating resin film, wherein the first metal layer has a smaller coefficient of thermal expansion than the second metal layer, which has a higher electric conductivity than the first metal layer. The invention also relates to a substrate for multilayer circuitry comprising a composite board comprising an iron-nickel alloy foil having a copper layer formed on both sides thereof, the composite board thermally glued under pressure to one or both sides of an insulating resin film.

In a further aspect, the invention provides a bare chip-mounted electronic apparatus comprising a multilayer circuit board comprising a laminate of at least one insulating resin layer and at least one wiring layer, on which substrate semiconductor devices are directly bonded, wherein the multilayer circuit board comprises the multilayer circuit board described above or is from the process described above.

The copper layer may be deposited on the iron-nickel alloy layer by electric plating or sputtering. Alternatively, a copper foil manufactured by electrolysis or metal rolling may be mechanically attached to the iron-nickel alloy under pressure. The step of forming a copper layer on the iron-nickel alloy layer may be performed after an insulating resin is laminated on the iron-nickel alloy beforehand. The layers may be laminated in the circuit board by a single batch process or by a build-up process. The blind via-hole may be formed by laser, plasma, or a drill. When a photosensitive insulating resin is employed, the via-hole may be formed by a process involving exposure to light and developing.

DESCRIPTION OF THE INVENTION

The invention will be hereafter described in detail by way of embodiments. The invention, however, is not limited to such embodiments.

Embodiment 1

Figure 1:
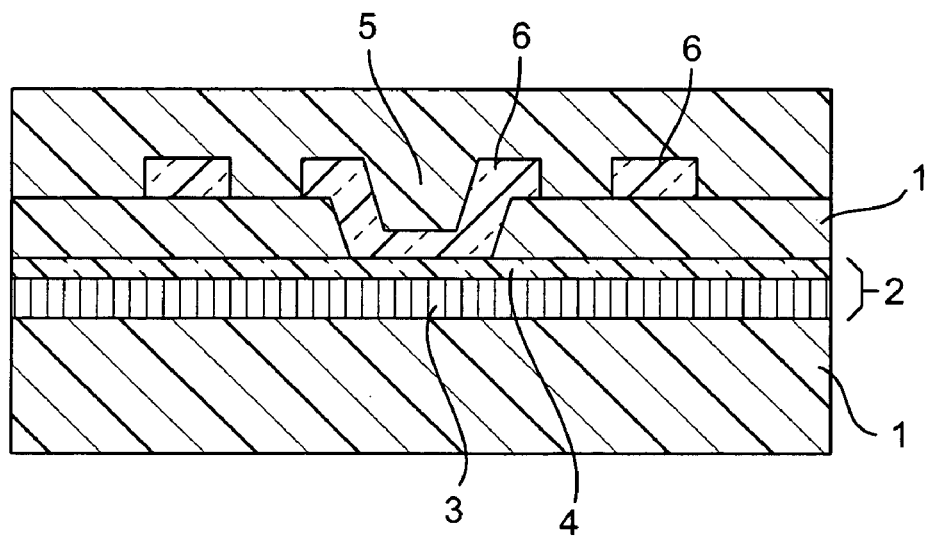
FIG. 1 shows a cross-section illustrating the manner in which the layers are electrically connected according to the invention.

FIG. 1 shows a cross-section of the multilayer circuit board according to the invention, in which a layer-to-layer connection portion is formed on one side of a composite board. In the present embodiment, the layer-to-layer connection portion is formed by copper plating 6, which is disposed in such a manner as to not be directly connected to an iron-nickel alloy. Specifically, a shown in FIG. 1, the plating 6 is in close contact with the surface of copper 4, such that the plating 6 is in contact with the copper 4 as the second metal layer covering a composite member 2, at the bottom of a blind via-hole 5. Thus, the plating 6 and the iron-nickel alloy 3 as the first metal layer are not in direct close contact with one another. In the example shown in FIG. 1, it is assumed that a circuit comprising the plating 6 or the composite member 2 exists in at least one of the inner layers of the multilayer circuit board. However, the plating 6 and the composite member 2 according to the invention may be used in either the inner or the outer layer. The composite member 2 is a foil with a thickness of about 80 μm, which is produced by flat-rolling a copper layer on one side of a layer of 42 alloy, which is an iron-nickel alloy containing 42 mass % of nickel, as will be described later, or a layer of covar, which is an iron-nickel alloy containing 29 mass % of nickel and 17 mass % of cobalt. An insulating resin layer 1 and the composite member 2 are integrated by heat-pressing with a vacuum press, as will be described later. After the insulating resin layer 7 is provided, a blind via-hole 5 is drilled by a carbon-dioxide gas laser drilling machine. Then, the copper plating 6 is formed in a manner that will be described later, and further predetermined circuit wiring is formed.

Thus, by adopting a structure in which the iron-nickel alloy in the composite member does not directly come into close contact with the plating for providing electrical connection between the layers, a multilayer circuit board is created that can maintain a high level of reliability in terms of electrical connection between the layers even when exposed to temperature changes brought about by the activation of the electric equipment.

Embodiment 2

Figure 2:
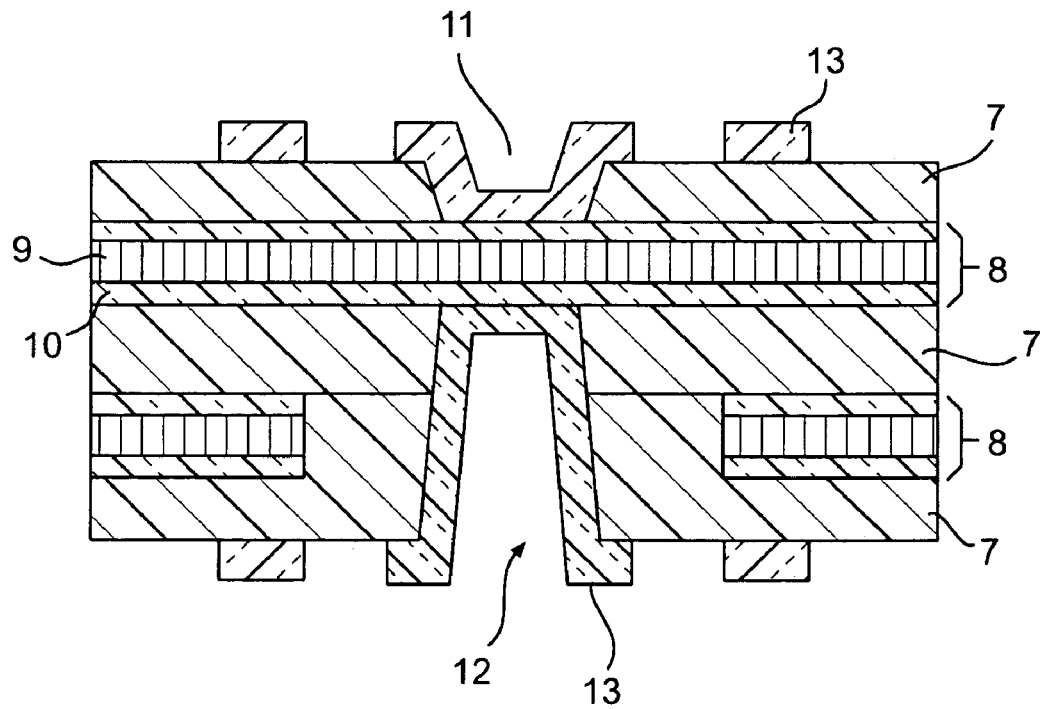
FIG. 2 shows a cross-section illustrating the manner in which the layers are electrically connected according to the invention.

FIG. 2 shows a cross-section of the multilayer circuit board according to the invention. The manufacturing process for the multilayer circuit board is the same as that for Embodiment 3. In a four-layer circuit board in which inner-layer circuits are formed by composite members 8 and outer-layer circuits are formed by plating 13, when connecting one of the inner-layer circuits to the outer layers on both sides, the composite member 8 comprising a first metal layer of iron-nickel alloy 9 coated by a second metal layer of copper 10 on both sides is employed such that the copper 10 is in close contact with the plating 13 at the bottom of the blind via holes 11 and 12. Thus, the plating 13 and the iron-nickel alloy 9 do not come into direct contact with one another. Thus, by adopting a structure where the iron-nickel alloy in the composite member does not directly come into close contact with the plating providing electric connection between the layers, a multilayer circuit board can be provided that can maintain a high level of reliability in terms of electrical connection between the layers, even when exposed to temperature changes caused by the activation of the electric equipment.

When through-holes are drilled in the iron-nickel alloy with a drill bit, the life of the drill bit is shortened. This problem can be overcome by the present invention, which does not require the drilling of through-holes. Further, the invention does not require the iron-nickel alloy to be exposed on the inner wall of the blind via-hole, nor does it require the cross-section of the iron-nickel alloy to be copper-plated. Thus, there is no need to perform special pre-processes for the copper plating, greatly contributing to cost reduction and improved yield.

Embodiment 3

FIG. 3 shows a cross-section of the manufacturing process for a multilayer circuit board according to the invention. Embodiment 3 concerns a four-layer circuit board in which an inner-layer circuit is formed by a composite member and an outer-layer circuit is formed by plating.

Figure 3A:
FIG. 3 illustrates the flow of a process of manufacturing a multilayer circuit board according to the invention.
Figure 3B:
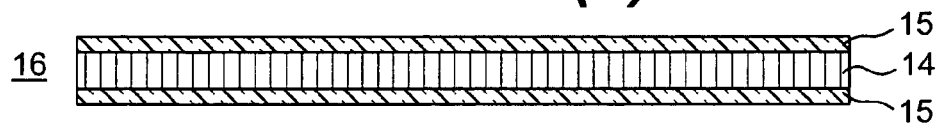
Figure 3C:
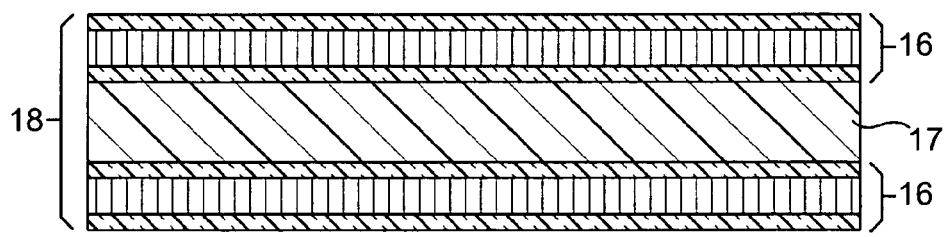

Initially, an iron-nickel alloy 14 as a first metal layer having a thickness of about 100 μm was prepared by cutting an iron-nickel alloy (YEF42 by Hitachi Metals, Ltd.) into desired dimensions (FIG. 3(a)).

Then, the iron-nickel alloy 14 was subjected to a dipping treatment in a degreasing solution (50 ml/L-METACLEAR CL-5513, by Dai-chi Kogyo Seiyaku Co., Ltd.) at 60° C. for two minutes and then washed with water. The iron-nickel alloy 14 was then subjected to a dipping treatment in a polishing solution (250 ml/L-CPL-200, by Mitsubishi Gas Chemical Company) at 30° C. for one minute. After washing with water, the alloy was subjected to a dipping treatment in an activator (300 ml/L-hydrochloric acid) at 25° C. for 30 seconds, and then washed with water. Then, the alloy was copper-plated with a copper sulfate plating solution (an additive 0.2 ml/L-CC-1220, by Nikko Metal Plating Co., Ltd.) at 25° C. for 10 minutes, with the current density of 2.5 A/dm$^2$. After washing with water, the alloy was dried in a drying furnace at 100° C. for 30 minutes, thus forming a composite member 16 coated by copper 15 with a thickness of about 5 μm as a second metal layer on either side thereof (FIG. 3(b)).

Then, the composite member 16 was set on each side of a polyimide film (UPILEX VT by Ube Industries. Ltd.) of a thickness of about 50 μm and pressed using a vacuum press at 350° C. under the pressure of 6 MPa for 10 minutes, thereby obtaining a metal foil base member 18 (FIG. 3(c)).

Thereafter, an etching resist (H-9025K by Hitachi Chemical Co., Ltd.) was laminated on either side of the base member 18 at 110° C. Then a film mask was placed on the resist on each side of the base member in a close-contact manner. The mask was then irradiated with ultraviolet light from an ultra-high pressure mercury lamp at the rate of 120 mJ/cm$^2$. The base member was then sprayed with a developing solution (10 g/L-sodium carbonate) at 30° C. under the pressure of 0.1 MPa for 20 seconds. After washing with water, the base member was sprayed with an etching solution (250 g/L-copper (II) chloride dehydrate, 200 ml/L-hydrochloric acid) at 50° C. for two minutes under the pressure of 2 MPa. After washing with water, the base member was sprayed with a resist removal solution (30 g/L-sodium hydroxide) at 40° C. for 30 seconds under the pressure of 0.1 MPa in order to remove the dry film resist. The base member was then washed with water and dried, thereby forming an inner-layer circuit 19 (FIG. 3(d)).

Figure 3D:
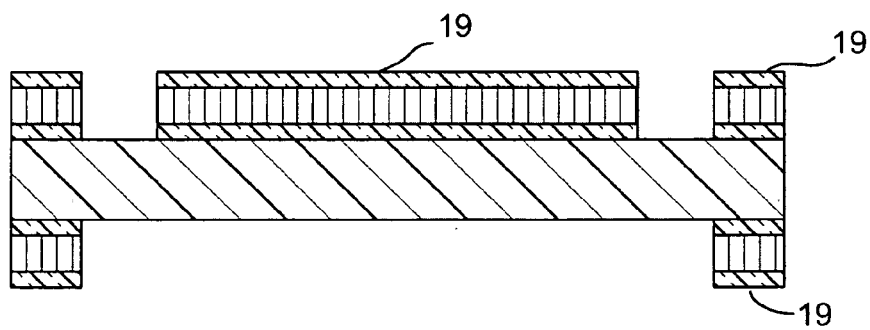
Figure 3E:
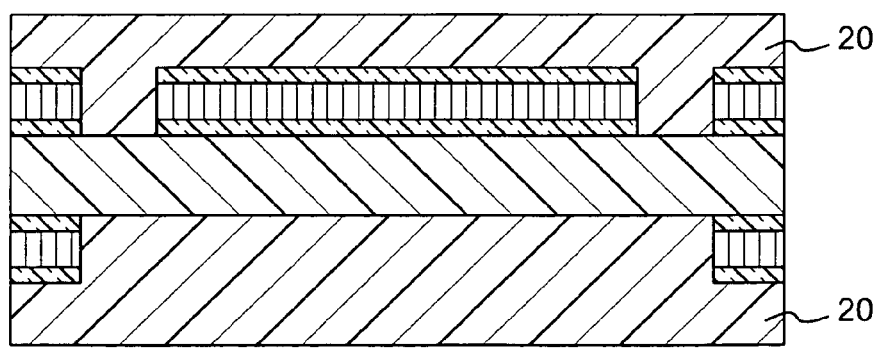
Figure 3F:
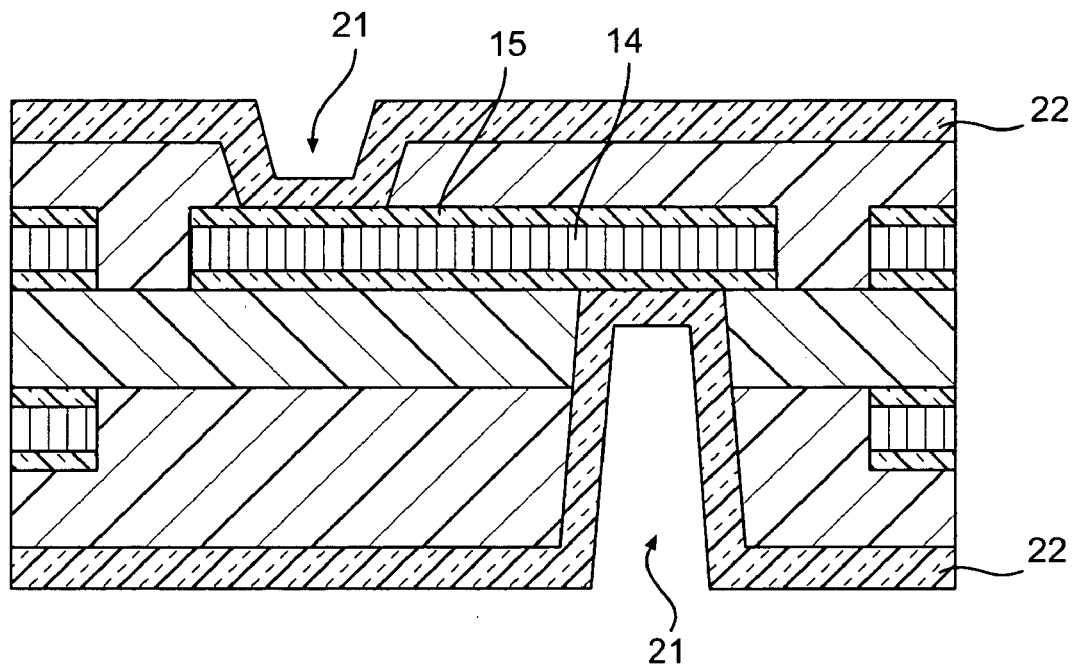

Thereafter, a polyimide film (UPILEX VT by Ube Industries. Ltd.) of a thickness of about 50 μm was set on either side of the base member having the inner-layer circuit 19 formed as shown in FIG. 3(d), the film having an electroplated copper foil (SLP-18 by Nippon Denkai, Ltd.) with a thickness of about 18 μm on one side thereof. The base member and the film were then press-laminated using a vacuum press (VHI-1624 by Kitagawa Seiki Co., Ltd.) at 350° C. for 10 minutes under the pressure of 6 MPa. The laminate was then sprayed with an etching solution (250 g/L-copper (II) chloride dehydrate, 200 ml/L-hydrochloric acid) at 50° C. for 30 seconds under the pressure of 0.2 MPa. After washing with water and drying, the electroplated copper foil on either surface was removed, thereby forming an insulating layer 20 that is very closely adhered to each surface (FIG. 3(e)).

Then, a blind via-hole 21 of about ϕ100 μm was drilled using a carbon-dioxide gas laser drilling machine such that the via-hole reaches the surface of the copper 15 without penetrating the composite member 16. The laminate was then treated with a desmearing solution (MLB-497 by Meltex, Inc.) at 70° C. for three minutes, washed with water, treated with a neutralizer (MLB-790 by Meltex, Inc.) at 60° C. for five minutes, and then washed with water. The laminate was further treated with a plating catalysis solution (HS-202B by Hitachi Chemical Co., Ltd.) at 25° C. for five minutes. After washing with water, the laminate was dried, whereby a plating catalyst was attached on the laminate. This was followed by a treatment in an activator (100 ml/L-sulfuric acid) at 25° C. for 30 seconds. After washing with water, the laminate was dipped in an electroless copper plating solution (CUST-2000 by Hitachi Chemical Co., Ltd.) at 40° C. for 10 minutes. After washing with water, the laminate was copper-plated in a copper sulfate plating solution (an additive 0.2 ml/L-CC-1220 by Nikko Metal Plating Co., Ltd.) at 25° C. for 30 minutes at a current density of 2.5 A/dm$^2$. After washing with water, the laminate was dried in a drying furnace at 100° C. for 30 minutes, thereby forming a copper-plated layer 22 with a thickness of about 15 μm (FIG. 3(f)).

Figure 3G:
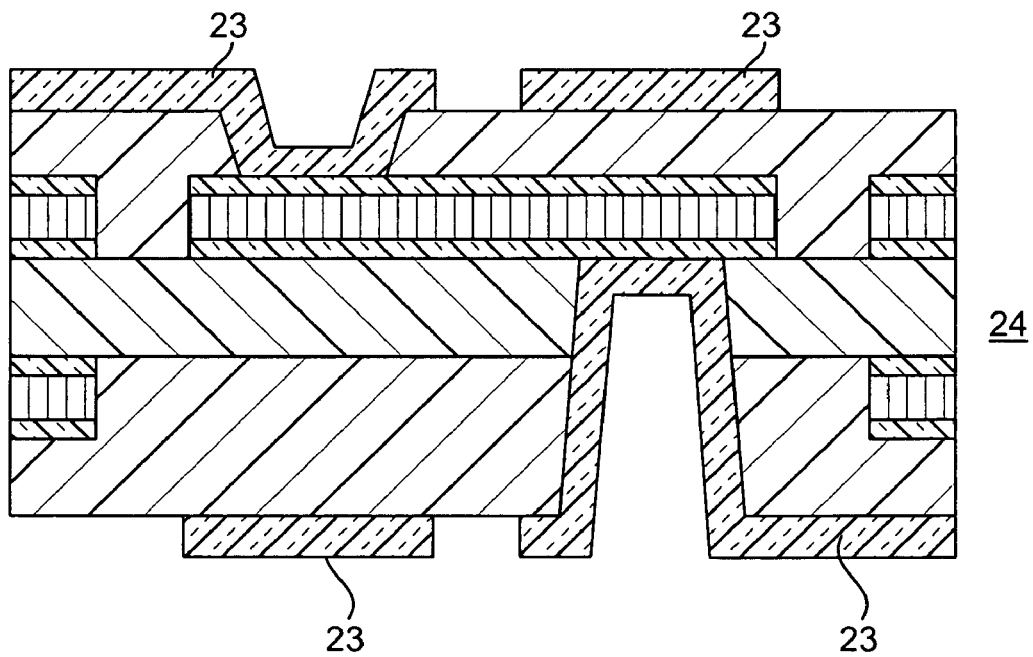

Next, an etching resist (H-9025K by Hitachi Chemical Co., Ltd.) was laminated on each side of the laminate at 110° C. A film mask was placed on each etching resist in a closely contacted manner, and the mask was irradiated with ultraviolet light from an ultra-high pressure mercury lamp at the rate of 120 mJ/cm$^2$. The laminate was then sprayed with a developing solution (10 g/L-sodium carbonate) at 30° C. for 20 seconds under the pressure of 0.1 MPa. After washing with water, the laminate was sprayed with an etching solution (250 g/L-copper (II) chloride dehydrate, 200 ml/L-hydrochloric acid) at 50° C. for 90 seconds under the pressure of 0.2 MPa. After washing with water, the laminate was sprayed with a resist removal solution (30 g/L-sodium hydroxide) at 40° C. for 30 seconds under the pressure of 0.1 MPa in order to remove the dry film resist. The laminate was then washed with water and dried, thereby forming an outer-layer circuit 23 and manufacturing a four-layer build-up substrate 24 (FIG. 3g).

Thus, in accordance with the present embodiment, a four-layer circuit board comprising an inner-layer circuit formed by a composite member is provided. The inner-layer circuit 19 comprising the composite member 16 and the outer-layer circuit 23 comprising the copper-plated layer 22 are electrically connected to one another by the close contact between the copper 15 coating the composite member 16 and the copper-plated layer 22 at the bottom of the via-hole. Thus, the iron-nickel alloy 14 and the copper-plated layer 22 are not directly in close contact with one another. The same is true when the iron-nickel alloy is substituted with an iron-nickel-cobalt alloy.

In accordance with the present embodiment, the inner-layer circuits comprise a power supply layer and a ground layer that are formed by the composite members, while the outer-layer circuits comprise a signal layer formed by the copper plating. One of the inner layers, that is either the power supply layer or the ground layer, is connected to the outer layers on both sides.

In the four-layer circuit board manufactured in Embodiment 3, one outer-layer circuit, one inner-layer circuit, and the other outer-layer circuit are electrically connected via 100 via-holes or through-holes that are arranged in a daisy-chain pattern. In order to evaluate the reliability of the multilayer circuit board in terms of its layer-to-layer electric interconnection, the circuit board was subjected to a thermal shock cycle test consisting of 500 cycles of thermal cycle tests from −55° C. for 30 minutes to 125° C. for 30 minutes, using a thermal shock tester (NT1500 by Kusumoto Chemicals, Ltd.). The interconnection was judged as defective when the rate of change in resistance value has reached 10% or more from the initial resistance value, and the number of cycles at that time was recorded.

As a result, in the present embodiment, the rate of change of resistance value was not more than 10% even after 500 cycles, and thus no defect was recognized. On the other hand, in a comparative example in which the layer-to-layer interconnection was formed by plating the cross-sectional surface of the iron-nickel alloy exposed in the through hole, the rate of change exceeded 10% at 286 cycles.

Thus, by employing a structure where the iron-nickel alloy in the composite member is not directly plated for layer-to-layer electric interconnection, a multilayer circuit board can be obtained that can maintain an improved level of layer-to-layer electrical interconnection even when exposed to temperature changes caused by the activation of the electric equipment.

Embodiment 4

FIG. 4 shows a cross-sectional view of the manufacturing process for a multilayer circuit board according to the invention. The steps described in FIGS. 4(a) to 4(d) correspond to those of FIGS. 3(a) to (d).

Figure 4A:
FIG. 4 illustrates the flow of a process of manufacturing another multilayer circuit board according to the invention.
Figure 4B:
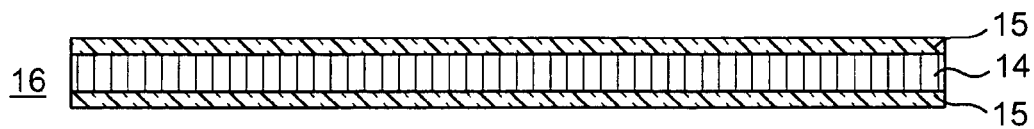
Figure 4C:
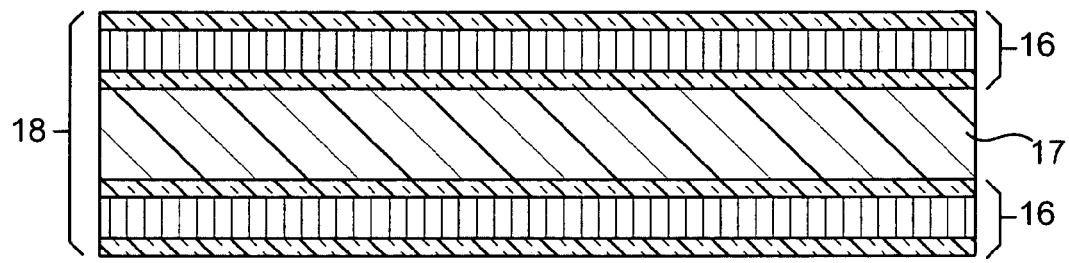
Figure 4D:
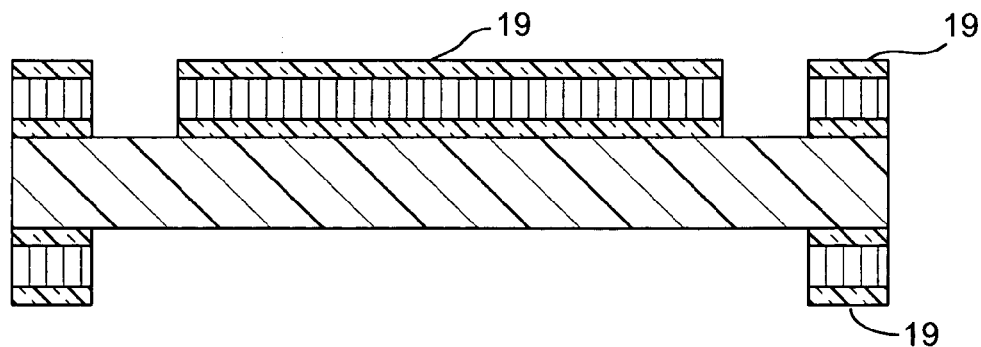
Figure 4E:
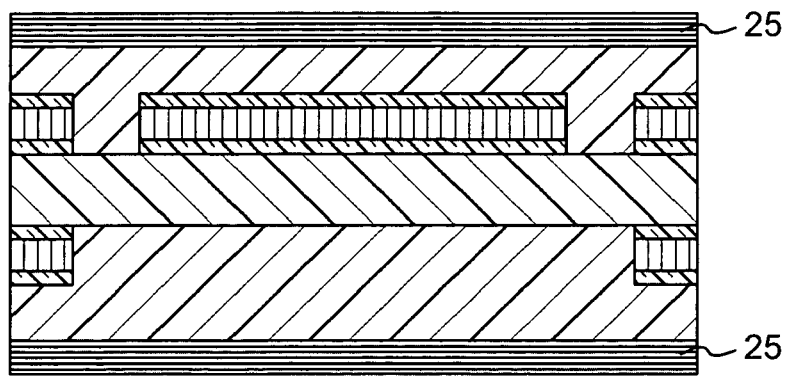

A polyimide film with a thickness of about 50 μm having an electroplated copper foil 25 with a thickness of about 18 μm on one side thereof, similar to the one used in Embodiment 3, was set on either side of the member with the inner-layer circuit 19 formed thereon and laminated using a vacuum press, as shown in FIG. 4(e).

Figure 4F:
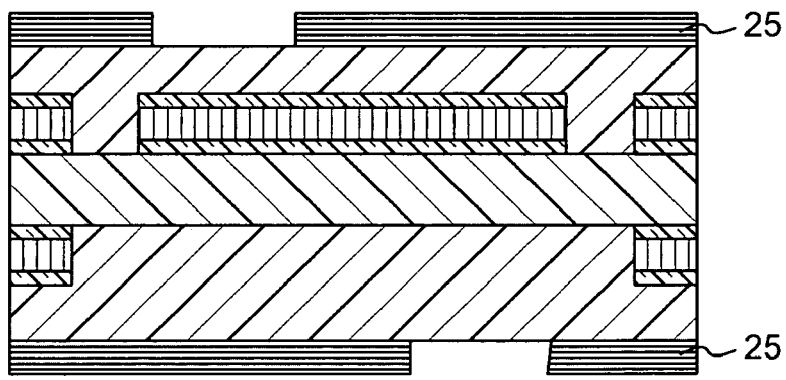

Then, the electroplated copper foil 25 was removed where a blind via-hole was to be formed, using the above-mentioned etching solution (FIG. 4(f)).

Figure 4G:
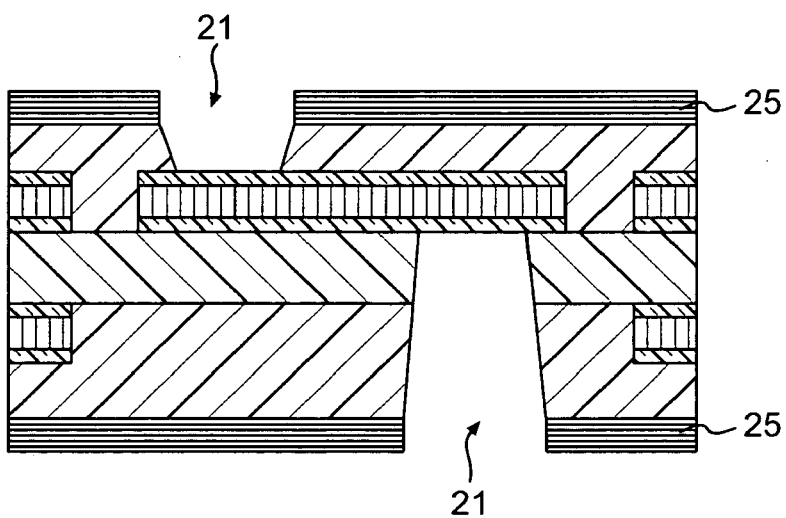
Figure 4H:
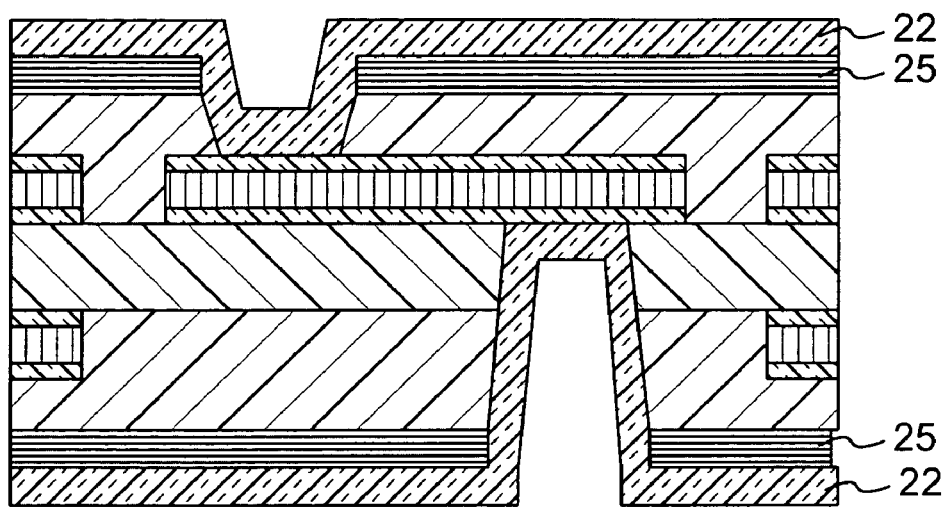
Figure 4I:
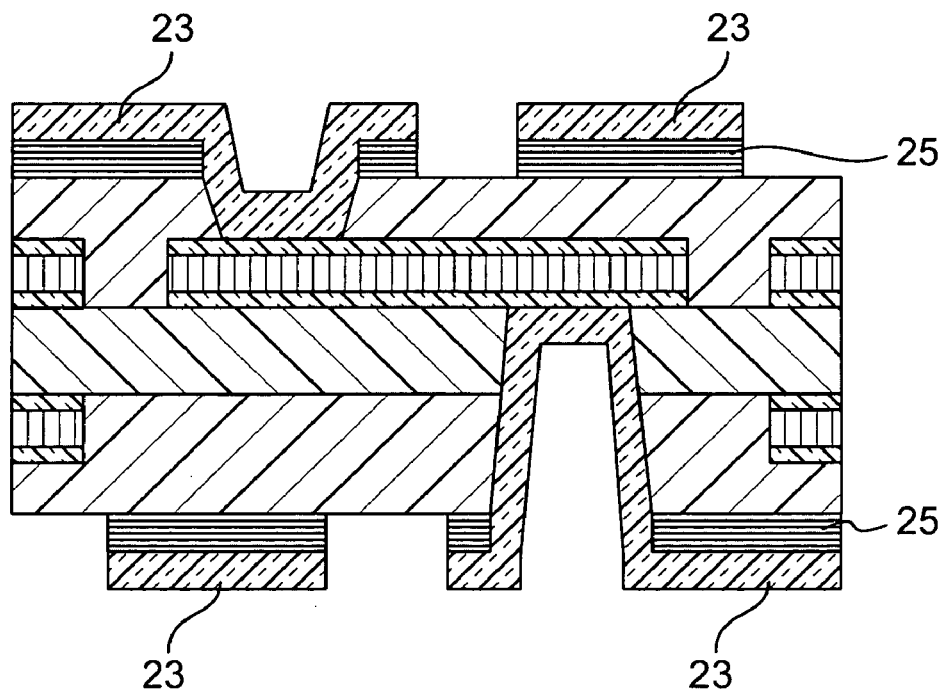

A blind via-hole 21 of about ϕ100 μm was then formed using a carbon dioxide gas laser drilling machine in a manner that the via-hole reached the surface of the copper 15 on each side but did not penetrate the composite member 16 (FIG. 4(g)).

The laminate was then treated with a desmearing solution at 70° C. for three minutes, washed with water, treated with a neutralizer at 60° C. for five minutes, and then washed with water. The laminate was further treated with a plating catalyst solution at 25° C. for five minutes. After washing with water, the laminate was treated with an activator at 25° C. for five minutes, washed with water, and then dried, whereby a plating catalyst was adhered. The laminate was then treated with an activator at 25° C. for 30 seconds, washed with water, and then dipped in an electroless copper plating solution at 40° C. for 10 minutes. After washing with water, the laminate was copper-plated with a copper sulfate plating solution at 25° C. for 30 minutes at the current density of 2.5 A/dm$^2$. After washing with water, the laminate was dried in a drying furnace at 100° C. for 30 minutes, thereby forming a copper-plated layer 22 with a thickness of about 15 μm, which is relatively thin (FIG. 4(h)).

Thereafter, an etching resist was laminated on the laminate at 110° C. on either side. A film mask was then placed on the resist in a closely contacted manner and irradiated with ultraviolet light from an ultra-high pressure mercury lamp at 120 mJ/cm². After spraying the laminate with a developing solution at 30° C. under the pressure of 0.1 MPa for 20 seconds, the laminate was washed with water and sprayed with an etching solution at 50° C. under the pressure of 0.2 MPa for 90 seconds. After washing with water, the laminate was then sprayed with a resist removal solution at 40° C. for 30 seconds under the pressure of 0.1 MPa in order to remove the dry film resist. After washing with water, the laminate was dried to form an outer-layer circuit 23, thereby manufacturing a four-layer build-up substrate 24 (FIG. 4(i)).

Thus, in accordance with the embodiment, the four-layer circuit board comprises inner-layer circuits formed by composite members. The inner-layer circuit 19 formed by the composite member 16 is electrically connected with the outer-layer circuit 23 formed by the copper-plated layer 22 by the close contact between the copper 15 coating the composite member 16 and the copper-plated layer 22 at the bottom of the via-hole. Thus, the iron-nickel alloy 14 and the copper-plated layer 22 are not directly in close contact with one another.

In accordance with the embodiment, the inner-layer circuits comprise a power supply layer and a ground layer that are formed by the composite members, while the outer-layer circuits comprise a signal layer formed by the copper plating. One of the inner layers, that is either the power supply layer or the ground layer, is connected to the outer layer on either side.

In the four-layer circuit board manufactured in Embodiment 4, one outer-layer circuit is electrically connected to one inner-layer circuit, and then to the other outer-layer circuit via 100 via-holes or through-holes to form a daisy-chain pattern. In order to evaluate the reliability of layer-to-layer electrical interconnection, a 500-cycle thermal shock cycle test was conducted in the same manner as in Embodiment 3, using the same evaluation standards. The results of the test showed that the rate of change in resistance value after 500 cycles was not more than 10%, thus indicating no abnormality.

Thus, by adopting the structure in which the iron-nickel alloy in the composite member is not directly in contact with the plating to provide layer-to-layer electrical interconnection, a multilayer circuit board can be obtained that can maintain a high level of reliability in terms of layer-to-layer electrical interconnection even when exposed to temperature changes caused by the activation of the electronic equipment.

COMPARATIVE EXAMPLE 1

The present comparative example concerns a four-layer circuit board comprising an inner-layer circuit made of a composite member and an outer-layer circuit made of copper plating. Hereafter, the process of manufacturing the circuit board will be described. The process includes the step (FIG. 3(a)) of preparing an iron-nickel alloy through to the step (FIG. 3(e)) of forming an insulating resin layer, as in Embodiment 1. The subsequent steps are shown in FIG. 5 via schematic cross-sectional views. In the present comparative example, the inner-layer circuit was formed by a composite member and the outer-layer circuit was formed by plating. The same is true when the iron-nickel alloy is replaced with an iron-nickel-cobalt alloy.

Figure 5A:
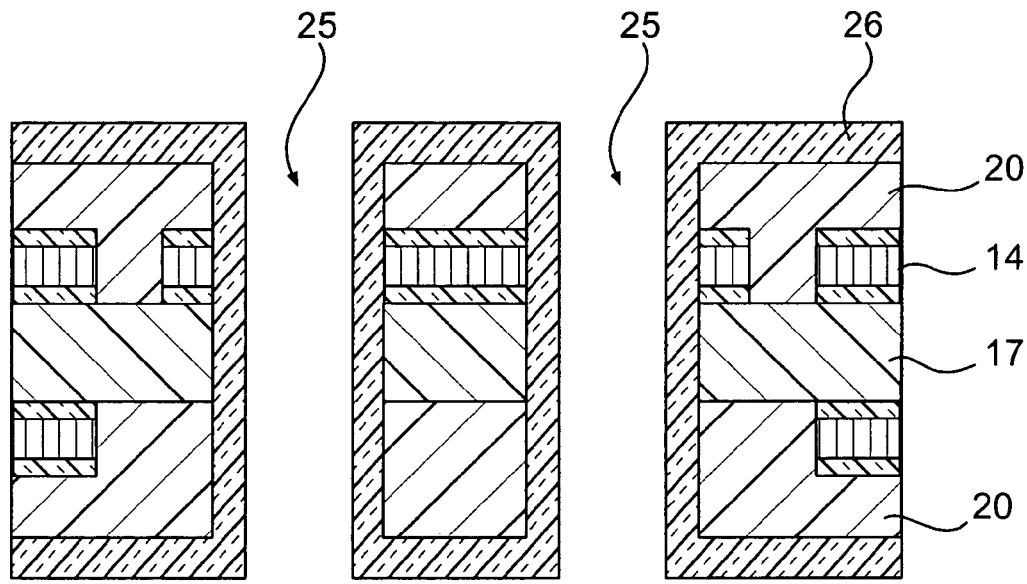
FIG. 5 illustrates the flow of a process of manufacturing another multilayer circuit board in a comparative example.

Referring to FIG. 5(a), through holes 25 with about φ300 μm were initially drilled using an NC drilling machine. The laminate was then treated with a desmearing solution (MLB-497 by Meltex) at 70° C. for five minutes. After washing with water, the laminate was treated with a neutralizer (MLB-790 by Mltex) at 60° C. for five minutes, and then washed with water. The laminate was further treated with a plating catalysis solution (HS-202B by Hitachi Chemical Co., Ltd.) at 25° C. for five minutes. After washing with water, the laminate was then treated with an activator (ADP-601 by Hitachi Chemical Co., Ltd.) at 25° C. for five minutes. The laminate was then washed with water and dried, whereby a plating catalyst was adhered thereto. Thereafter, the laminate was treated with an activator (100 ml/L-sulfuric acid) at 25° C. for 30 seconds. After washing with water, the laminate was subjected to a dipping treatment in an electroless copper plating solution (CUST-2000 by Hitachi Chemical Co., Ltd.) at 40° C. for 10 minutes. After washing with water, the laminate was copper-plated with a copper sulfate plating solution (an additive 0.2 ml/L-CC-1220, by Nikko Metal Plating Co., Ltd.) at 25° C. for 30 minutes, with the current density of 2.5 A/dm². After washing with water, the laminate was dried in a drying furnace at 100° C. for 30 minutes, thereby forming a copper-plated layer 26 with a thickness of about 15 μm.

Figure 5B:
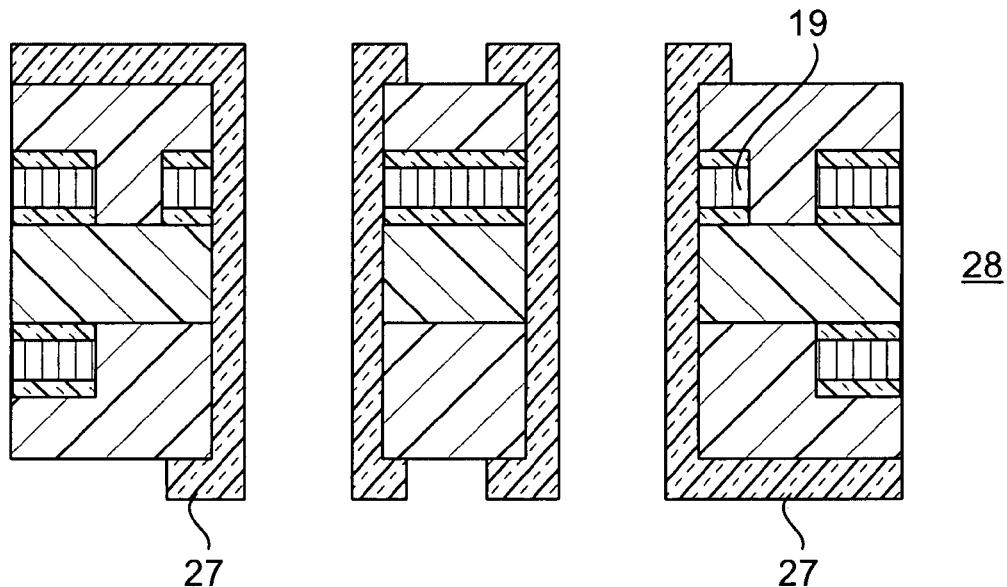

Then, an etching resist (H-9025K by Hitachi Chemical Co., Ltd.) was laminated on each side as shown in FIG. 5(b) at 110° C., and then a film mask was set on the resist in a closely contacted manner. After irradiating with ultraviolet light from an ultra-high pressure mercury lamp at 120 mJ/cm², the mask was sprayed with a developing solution (10 g/L-sodium carbonate) at 30° C. for 20 seconds under the pressure of 0.1 MPa. After washing with water, the laminate was sprayed with an etching solution (250 g/L-copper (II) chloride dehydrate, 200 ml/L-hydrochloric acid) at 50° C. for 90 seconds under the pressure of 0.2 MPa. After washing with water, the laminate was sprayed with a resist removal solution (30 g/L-sodium hydroxide) at 40° C. for 30 seconds under the pressure of 0.1 MPa in order to remove the dry film resist. The laminate was then washed with water and dried, thereby forming an outer-layer circuit 27 and manufacturing a four-layer circuit board 28.

In the present comparative example, the four-layer circuit board comprises an inner circuit formed by a composite member. The inner-layer circuit 19 formed by the composite member 16 is electrically connected to the outer-layer circuit 27 formed by the copper-plated layer 26 by the close contact between the cross-section of the composite member 16 and the copper-plated layer 26 of the through hole portion on the inner wall of the though hole. Thus, the iron-nickel alloy 14 and the copper-plated layer 26 are in direct and close contact with one another. The same is true when the iron-nickel alloy 14 is substituted with an iron-nickel-cobalt alloy.

In the four-layer circuit board manufactured in the present comparative example, the same pattern as in Embodiment 3 is formed, and one outer-layer circuit, one inner-layer circuit, and the other outer-layer circuit are electrically connected via 100 via-holes or through-holes that are arranged in a daisy-chain pattern. In order to evaluate the reliability of layer-to-layer electrical interconnection, a thermal shock cycle test was conducted in the same manner as in Embodiment 3.

The results showed that in the comparative example, the rate of change reached 10% at 286 cycles. When the cross-section of the through hole which has the highest resistance value of the through hole portion (layer-to-layer interconnection portion) was examined, a partial peeling of the copper plating from the iron-nickel alloy was observed. This was due to the cracking in the copper plating in the vicinity of the interface between the iron-nickel alloy and the copper coating. The cracking is the result of the severe nature of the thermal shock test, and the present characteristics can provide a sufficient level of reliability.

In the present comparative example, the inner-layer circuits comprised a power supply layer and a ground layer that were formed by the composite members, while the outer-layer circuits comprised a signal layer formed by the copper plating. One of the inner layers, that is either the power supply layer or the ground layer, was connected to the outer layers on both sides.

COMPARATIVE EXAMPLE 2

Figure 6:
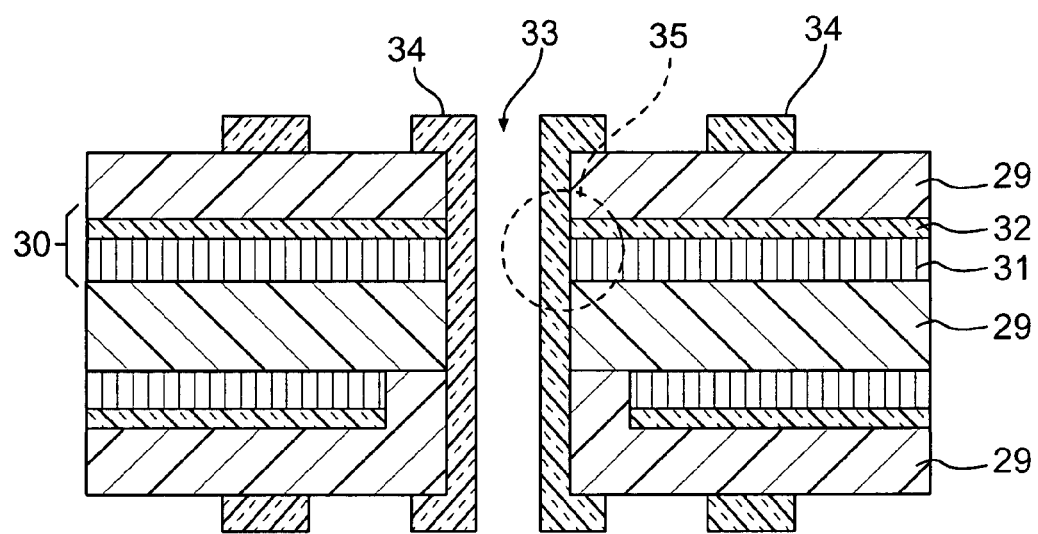
FIG. 6 illustrates the manner in which the layers are electrically connected in a comparative example.

FIG. 6 shows a cross-section of a multilayer circuit board employing a composite member comprising an iron-nickel alloy having a copper plating on one side thereof, shown in FIG. 5. In the present comparative example, a four-layer circuit board was actually manufactured employing a composite member comprising an iron-nickel alloy with a copper coating. The inner-layer circuits were formed by the composite members comprising a power supply layer and a ground layer, while the outer-layer circuits comprise a signal layer formed by copper plating. One of the inner layers, that is either the power supply layer or the ground layer, was connected to the outer layer on either side. As shown in FIG. 6, when the through hole 33 was provided that has the copper plating 34, the connection portion 35 between the iron-nickel alloy 31 and the copper plating 34 was subject to the stress caused by their thermal expansion differences that manifest themselves as a result of temperature changes that occur during actual operation. As a result, the connection portion is slightly more likely to suffer the peeling of the copper plating 34 from the iron-nickel alloy 31, an increase in connection resistance, or defective electric connection, as compared with the above described Embodiments 1 to 4. The manufacturing process for the present comparative example is the same as that for Comparative Example 1. The same is true when the iron-nickel alloy is replaced with an iron-nickel-cobalt alloy.

Embodiment 5

Figure 7:
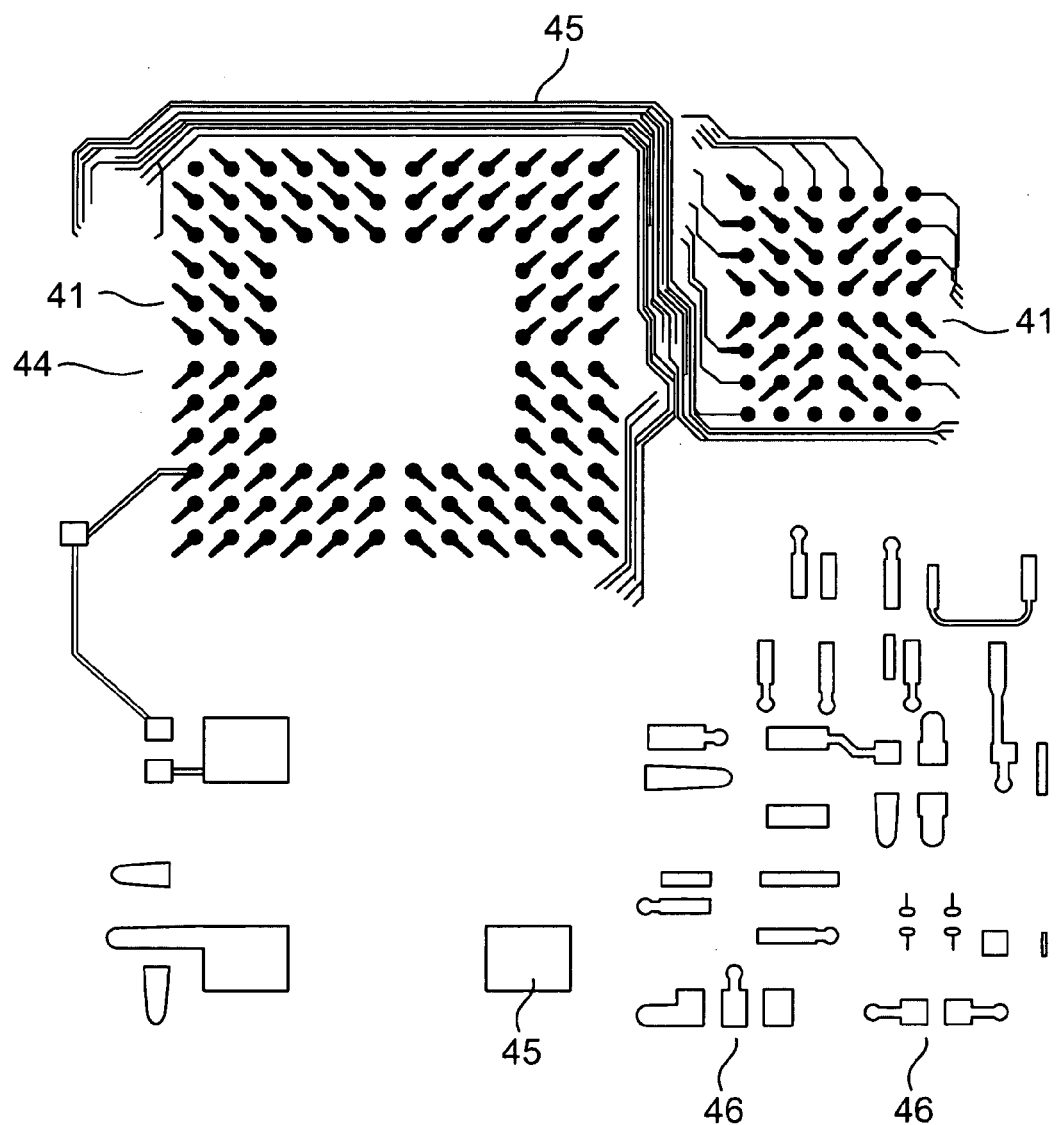
FIG. 7 shows a plan view of the multilayer circuit board according to the invention.
Figure 8:
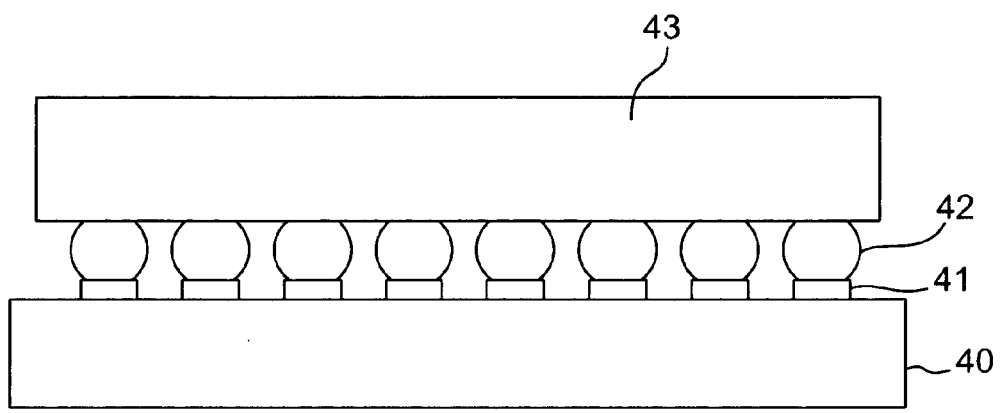
FIG. 8 shows a cross-section of an electronic apparatus according to the invention.

FIG. 7 shows a plan view of the multilayer circuit board of the invention near where a semiconductor device is to be mounted. FIG. 8 shows a cross-sectional view of an electronic apparatus comprising the substrate of FIG. 7 on which a semiconductor device is mounted. The electronic apparatus according to this embodiment comprises the multilayer circuit board 40 obtained in any of Embodiments 1 to 6, wherein a semiconductor device 43 is directly bonded (bare chip mount) to connecting terminals 41 provided on the surface of the substrate 40 via soldering balls 42. The two areas containing black dots are connecting terminals 41 in a semiconductor device-mounted region 44 where the semiconductor device 43 is to be mounted. Black squares and lines indicate wires 45. As shown in FIG. 8, the semiconductor device 43 is directly bonded via the soldering balls 42. Numeral 46 designates component terminals. In accordance with the present embodiment, by employing a multilayer circuit board having a circuit layer comprising a composite member that is formed by coating an iron-nickel alloy with copper on one or both sides, an electronic apparatus can be obtained that can maintain a highly level of reliability in terms of layer-to-layer electric interconnection in the multilayer circuit board as well as electric connection between the semiconductor device and the multilayer circuit board even when exposed to temperature changes during actual operation.

Thus, in accordance with the invention, a multilayer circuit board is employed in which a circuit layer comprises a composite member formed by coating an iron-nickel alloy with copper on at least one surface thereof. Thus, the invention can provide a multilayer circuit board that can maintain a high level of reliability against temperature changes during operation in terms of layer-to-layer electric interconnection, a process of manufacturing the same, a substrate for multilayer circuitry, and an electric apparatus.

What is claimed is:

1. A multilayer circuit board comprising a laminate of at least one insulating layer and a plurality of wiring layers separated from one another by the insulating layer, wherein at least one of the wiring layers is formed by a composite material including a first metal layer and a second metal layer formed on one or both sides of the first metal layer, the first metal layer having a smaller coefficient of thermal expansion than the second metal layer, the second metal layer having a higher electric conductivity than the first metal layer, wherein the insulating layer in contact with the second metal layer has a blind via-hole whose bottom portion is formed by a surface of the second metal layer, and the composite material and the wiring layers are in a layer-to-layer interconnection with one another through a layer-to-layer interconnection portion which is in contact with the second metal layer formed in the blind via-hole.

2. The multilayer circuit board according to claim 1, wherein the wiring layer formed on the surface of the insulating layer is a plated metal layer or a sequentially formed layered structure, which consists of a metal foil and a plated metal layer on it.

3. The multilayer circuit board according to claim 1, wherein the first metal layer or the iron-nickel alloy layer comprises an alloy whose average thermal expansion coefficient at temperatures from 30 to 200° C. is not more than $10 \times 10^{-6}/°$ C., an iron alloy containing 27 to 50 mass % of nickel, or the iron alloy in which the nickel is substituted with not more than 20 mass % of cobalt.

4. The multilayer circuit board according to claim 1, wherein the second metal layer is copper.

5. An electronic apparatus comprising a multilayer circuit board comprising a laminate of at least one insulating resin layer and at least one wiring layer, on which multilayer circuit semiconductor devices are directly bonded,
wherein the multilayer circuit board comprises the multilayer circuit board according to claim 1.

6. A multilayer circuit board comprising at least one wiring layer formed in insulating layers, wherein at least one of the wiring layers is formed by a composite material comprising a first metal layer and a second metal layer formed on either side of the first metal layer, the first metal layer having a smaller coefficient of thermal expansion than the second metal layer, the second metal layer having a higher electric conductivity than the first metal layer, wherein the insulating layers facing one another via the composite material have a blind via-hole whose bottom portion is formed by a surface of the second metal layer, wherein the circuit board further comprises a layer-to-layer interconnection portion on the surface of the insulating layer and in the blind via-hole, wherein the layer-to-layer interconnection portion in each blind via-hole is formed in such a manner as to be in contact with the second metal layer surface.

7. A multilayer circuit board comprising a laminate of at least one insulating layer and a plurality of wiring layers separated one another by said insulating layer, wherein at least one of the wiring layers is formed by a composite material comprising an iron-nickel alloy layer having a copper layer formed on one or both sides thereof, wherein the insulating layer in contact with a surface of the copper layer has a blind via-hole whose bottom portion is constituted by a surface of the copper layer, wherein a layer-to-layer interconnection portion is provided on the surface of the insulating layer and in the blind via-hole, the layer-to-layer interconnection portion being formed in such a manner as to be in contact with the copper layer surface.

8. A multilayer circuit board comprising insulating layers in which at least one wiring layer is formed, wherein at least one of the wiring layers is formed by a composite material of an iron-nickel alloy having a copper layer formed on both sides thereof, wherein each of the insulating layers facing one another via the composite material has a blind via-hole whose bottom portion is constituted by a surface of the second metal layer, wherein the circuit board further comprises a layer-to-layer interconnection portion on the surface of the insulating layer and in the blind via-hole, wherein the layer-to-layer interconnection portion in each blind via-hole is formed in such a manner as to be in contact with the second metal layer surface.

9. A process of manufacturing a multilayer circuit board in which at least one insulating layer and a plurality of wiring layers separated from one another by the insulating layer are laminated, the process comprising the steps of:
  forming a wiring on the wiring layer in a composite material including the wiring layer and the insulating layer integrally formed on the wiring layer, the wiring layer including a second metal layer formed on one or both sides of a first metal layer,
  wherein the second metal layer has a larger coefficient of thermal expansion than the first metal layer;
  forming a blind via-hole in the insulating layer such that a bottom portion of the via-hole is formed by a surface of the second metal layer; forming a layer-to-layer interconnection portion on the surface of the insulating layer, and in the blind via-hole and the composite material and the wiring layers are in a layer-to-layer interconnection with one another through a layer-to-layer interconnection portion which is in contact with the second metal layer formed in the blind via-hole.

10. An electronic apparatus comprising a multilayer circuit board comprising a laminate of at least one insulating resin layer and at least one wiring layer, on which multilayer circuit semiconductor devices are directly bonded,
  wherein the multilayer circuit board is manufactured according to the method described in claim 9, and
  wherein the composite material and the wiring layers are in a layer-to-layer interconnection with one another through a layer-to-layer interconnection portion which is in contact with the second metal layer formed in the blind via-hole.

11. A process of manufacturing multilayer circuit board comprising an insulating layer in which at least one wiring layer is formed, the process comprising the steps of:
  forming a wiring on the wiring layer in a composite material including the wiring layer and the insulating layer integrally formed on the wiring layer, the wiring layer comprising a second metal layer formed on one or both sides of a first metal layer,
  wherein the second metal layer has a larger coefficient of thermal expansion than the first metal layer;
  forming a blind via-hole in each insulating layer on the opposite surface between which the wiring layer is inserted, the blind via-hole having a bottom portion formed by a surface of the second metal layer; and
  forming a layer-to-layer interconnection portion on the surface of the insulating layers in each blind via-hole and the composite material and wiring layers are in a layer-to-layer interconnection with one another through a layer-to-layer interconnection portion which is in contact with the second metal metal layer formed in the blind via-hole.

12. A process of manufacturing a multilayer circuit board comprising the steps of:
  preparing a wiring layer formed by a composite material including a first metal layer and a second metal layer formed on one or both sides of the first metal layer, the second metal layer having a higher electric conductivity and a greater coefficient of thermal expansion than the first metal layer;
  forming a substrate for multilayer circuitry by laminating the wiring layer on one or both sides of an insulating resin layer;
  forming a predetermined wiring on the wiring layer;
  covering the wiring formed in the wiring forming step with an insulating layer;
  forming a blind via-hole in the insulating layer, or the insulating layer and insulating resin layer, the blind via-hole having a bottom portion formed by a surface of the second metal layer; and forming a layer-to-layer interconnection portion on the surface of the insulating layer and in the blind via-hole and the composite material and wiring layers are in a layer-to-layer interconnection with one another through a layer-to-layer interconnection portion which is in contact with the second metal layer formed in the blind via-hole.

13. A process of manufacturing a multilayer circuit board comprising the steps of:
  preparing a wiring layer formed by a composite material comprising a first metal layer and a second metal layer formed on both sides of the first metal layer, the second metal layer having a higher electric conductivity and a greater coefficient of thermal expansion than the first metal layer;
  forming a substrate for multilayer circuitry by laminating the wiring layer on both sides of an insulating layer;
  forming a predetermined wiring on the wiring layer formed in the wiring preparing step;
  covering the wiring formed in the wiring forming step with an insulating layer;
  forming a blind via-hole in each insulating layer, or the insulating layer and insulating resin layer on the opposite surfaces between which the insulating layer is inserted, the blind via-hole having a bottom portion formed by a surface of the second metal layer; and
  forming a layer-to-layer interconnection portion on the surface of the insulating layer and in the blind via-hole and the composite material and wiring layers are in a layer-to-layer interconnection with one another through a layer-to-layer interconnection portion which is in contact with the second metal layer formed in the blind via-hole.

* * * * *